(12) United States Patent
Wrycraft

(10) Patent No.: US 6,867,980 B2
(45) Date of Patent: Mar. 15, 2005

(54) CABLE MANAGEMENT SYSTEM

(75) Inventor: Sean Conor Wrycraft, Harrow (GB)

(73) Assignee: Sun Microsystems, Inc., Santa Clara, CA (US)

( * ) Notice: Subject to any disclaimer, the term of this patent is extended or adjusted under 35 U.S.C. 154(b) by 152 days.

(21) Appl. No.: 10/166,529

(22) Filed: Jun. 10, 2002

(65) Prior Publication Data

US 2003/0227753 A1 Dec. 11, 2003

(51) Int. Cl.[7] .............................. H05K 7/16; A47F 7/00
(52) U.S. Cl. .................... 361/727; 361/724; 312/334.4; 211/26; 211/168; 174/68.3
(58) Field of Search .................. 361/724–727, 361/825, 826; 312/223.1, 223.2, 334.11, 334.4, 265.1, 265.4, 330.1; 211/26, 151, 80, 81, 85, 95–103, 168–174, 104, 11, 132.1; 174/68.1–69, 52.1, 52.4

(56) References Cited

U.S. PATENT DOCUMENTS

| | | | |
|---|---|---|---|
| 3,710,199 A | | 1/1973 | Cignoni, Jr. |
| 4,614,383 A | * | 9/1986 | Polley et al. ............... 361/727 |
| 5,443,312 A | | 8/1995 | Schluter |
| 5,460,441 A | * | 10/1995 | Hastings et al. ............ 312/298 |
| 5,571,256 A | * | 11/1996 | Good et al. .................... 211/26 |
| 5,726,866 A | * | 3/1998 | Allen .......................... 361/816 |
| 5,890,602 A | | 4/1999 | Schmitt |
| 6,070,742 A | * | 6/2000 | McAnally et al. ............. 211/26 |
| 6,142,590 A | * | 11/2000 | Harwell .................... 312/223.1 |
| 6,194,664 B1 | | 2/2001 | Zamora et al. |
| 6,259,604 B1 | | 7/2001 | Küster |
| 6,305,556 B1 | * | 10/2001 | Mayer .......................... 211/26 |
| 6,373,707 B1 | * | 4/2002 | Hutchins ..................... 361/725 |
| 6,424,534 B1 | * | 7/2002 | Mayer et al. ................ 361/724 |
| 6,435,354 B1 | * | 8/2002 | Gray et al. .................... 211/26 |
| 6,442,030 B1 | * | 8/2002 | Mammoser et al. ........ 361/727 |
| 6,501,020 B2 | * | 12/2002 | Grant et al. ................... 174/69 |
| 6,523,918 B1 | * | 2/2003 | Baiza ....................... 312/265.1 |
| 6,600,665 B2 | * | 7/2003 | Lauchner ..................... 361/826 |
| 6,685,033 B1 | * | 2/2004 | Baddour et al. .............. 211/26 |
| 6,772,887 B2 | * | 8/2004 | Audibert et al. .............. 211/26 |
| 2001/0037985 A1 | * | 11/2001 | Varghese et al. .............. 211/26 |
| 2003/0222034 A1 | * | 12/2003 | Champion et al. ............ 211/26 |
| 2003/0226812 A1 | * | 12/2003 | Wrycraft ..................... 211/26 |

\* cited by examiner

Primary Examiner—Lisa Lea-Edmonds
(74) Attorney, Agent, or Firm—Meyertons Hood Kivlin Kowert & Goetzel, P.C.; B. Noël Kivlin

(57) ABSTRACT

A rack for an electronics assembly comprises:
  (i) a supporting frame (22, 24);
  (ii) a slider mechanism (4) having a first part (6) that is supported by the frame and a second part (8) that supports the electronics assembly, the mechanism configured to allow the assembly to be moved out of the rack; and
  (iii) a cable management system for supporting cables located at the rear of the assembly. The cable management system comprises an articulated arm having a first end coupled to the assembly and a second end coupled to the first part (6) of the slider mechanism so that bending of the arm accommodates movement of the electronics assembly.

The cable management system ensures that the assembly can be pulled out of the rack by the required distance irrespective of the depth of the rack.

17 Claims, 4 Drawing Sheets

CABLE MANAGEMENT SYSTEM

BACKGROUND OF THE INVENTION

The present invention relates to electronics assemblies, and is primarily concerned with racked assemblies. Many such assemblies will be located in racks for housing in for example nineteen inch cabinets, or other size cabinets such as twenty three inch or metric cabinets. The assemblies may for instance be employed as servers for a number of systems, for example in local area networks (LANs), wide area networks (WANs), telecommunications systems or other operations such as database management or as internet servers.

Such an assembly will typically comprise a supporting chassis that houses a motherboard or backplane and a number of daughterboards or module cards that extend in planes generally perpendicular to the plane of the motherboard and which are connected to the motherboard by connectors, e.g. high density connectors, so that the daughterboards can simply be located on guides and pushed toward the motherboard in order to connect them to it. An assembly will typically have dimensions in the order of 0.5 m in each direction and will be located in a rack for example a cabinet, in an office, data centre, computer room or similar environment. Often, more than one such assembly is located in the same rack, and will need to be accessed from time to time for routine maintenance, repair or upgrading.

In order to enable a service engineer to access an assembly located in such a rack, the rack will normally comprise a supporting frame and a slider mechanism, one part of which is fixed on the supporting frame and the other part of which supports the electronics assembly, so that the assembly can be pulled out of the rack on the slider mechanism, and then, after work has been conducted on the assembly, can be pushed back into the rack. The slider mechanism will need to allow the assembly to be pulled out by at least the depth of the assembly, for example 0.5 m, in order to allow access to the rear parts thereof. The electronics assembly will usually have a large number of electrical cables both for signals and power, and possibly including optical cables, extending from the rear thereof to the rack and beyond, and it is therefore necessary either to disconnect all interface and power cables whenever the assembly is withdrawn from the rack or to provide some form of cable management system that will support a service loop of cables having a length at least equal to the distance by which the assembly is moved as it is withdrawn from the rack.

Such cable management systems conventionally have taken the form of an articulated arm, one end of which is connected to the electronics assembly, and the other end of which is mounted on a rear part of the interior of the rack, so that the arm can accommodate movement of the assembly on the slider mechanism by bending and straightening. However, the cables may be of a number of different constructions, and may be able to bend by different amounts. The system may, for example, include optical fibre cables in which the fibres have a minimum bend radius to prevent leakage of signals, or relatively thick power cables may be present which cannot be bent over small bend radii without damage. In such circumstances, conventional cable management systems may require a significant depth of the cabinet, in excess of the chassis of the electronics assembly, in order to hold the cabling.

SUMMARY OF THE INVENTION

According to one aspect, the present invention provides a rack for an electronics assembly comprising:

(i) a supporting frame;
(ii) an electronics assembly configured to be removed from a first side of the rack; and
(iii) a cable management system comprising an articulated arm formed from at least two articulated members that are connected together at a joint, the arm having a first end which is attached to the assembly and a second end which is fixed with respect to the rack so that bending of the arm about a pivot axis at the joint accommodates movement of the assembly, wherein the cables are arranged on the articulated arm so that at least some of the cables extend in a direction parallel to the pivot axis in the region of the joint and accommodate relative movement of the members by torsion.

The rack according to the invention has the advantage that, because the cables extend parallel to the axis of pivoting at the joint in the articulated arm, they will bend in the same (vertical) plane as the rear face of the chassis, and so may have as large a bend radius as necessary without increasing the depth of the cabinet that is required to hold the cable service loop behind the assembly.

The pivot axis in the joint in the articulated arm may extend either horizontally or vertically. In many designs, horizontal, or substantially horizontal arms, may be used which swing out about a vertical axis when the assembly is withdrawn from the front of the cabinet. However, this cable management system may also be employed in racks in which the articulated arm extends in a vertical plane and is articulated by means of a joint having a horizontal pivot axis. In either case, when the electronics assembly is positioned within the rack, the cabling will bend in a vertical plane parallel to the plane of the rear face of the assembly, and so will take up the minimum of depth of the cabinet.

In order to ensure that the cables bend in the same plane as the rear face of the electronics assembly, the articulated members can be offset from one another in the direction of the pivot axis, at least in the region of the joint. The degree to which they are offset will depend, amongst other things, on the type of cables and the minimum bend radius required. Thus, for optical cables, a minimum bend radius of 60 mm may be appropriate, while for large power cables, a bend radius of at least 100 or 150 mm may be necessary. Often the bend radius will be determined by the number and size of the cables, which will determine the lateral dimensions of the articulated members. In such a case, it may be appropriate for the articulated members to be offset, at least in the region of the joint, by at least their width. Such an arrangement may be achieved simply by locating the articulated members adjacent to one another on a hinge pin at the joint.

In principle, both articulated members forming an articulated arm may extend horizontally from the assembly and the rack. However, if the articulated arm has a degree of height in order to provide a minimum bend radius of the cabling, it is possible for one or both of the articulated members to be oblique or to slope if desired, so that it or they can provide a degree of support and mechanical rigidity in the vertical direction. In this case, one of the members could be horizontal and the end thereof adjacent to the joint could be supported by the other member, or both members could be oblique and thus provide some degree of support.

The end of the articulated arm that is fixed with respect to the rack may be fixed to any appropriate part thereof. For example, such racks often include a number of supporting posts on which a slider mechanism, normally in the form of a pair of telescopic sliders, may be supported. The fixed end of the articulated arm may be attached to any of the supporting posts at any appropriate height, or it may be attached to a fixed part of the slider mechanism.

The cable management system may comprise a single articulated arm only, but it is also possible for it to comprise more than one arm. For example, one or more arms may be located on each side of the rack. Alternatively or in addition, one of the arms may be located above the or any other arm on the same slider. Such an arrangement in which more than one arm is employed enables the system to separate data cables from power cables by using different arms to support different types of cable. The system may, for example comprise two articulated arms, each of which having one oblique articulated member, one end of each of which is fixed to the rack at approximately a point at mid height of the electronics assembly, and may be fixed to the slider mechanism. The other end of each oblique articulated member may be joined to a horizontal articulated member that is attached to the chassis at either the top or the bottom thereof.

The or each articulated arm may comprise a plurality of members that are concatenated by means of hinges. For example the or each arm may comprise two members that are joined by a hinge and each of which is attached at its other end to one of the electronics assembly or to the rack. In this case, each member forming the articulated arm may have a length in the region of the width of the electronics assembly in order to maximise the reach of the arm. However, other forms of arm are also possible. For example, the arm may have three members each of which is joined to the or each adjacent member by a hinge. Such an arm will have a substantially "Z" shape in which one end is joined to the left hand side of the rack or assembly, and the other end is joined to the right hand side of the assembly or rack respectively. In another form, of system, the articulated arm may have four concatenated members that are joined by three hinges. In this design of system, the two outer members of the arm may be attached to the electronics assembly and to the fixed part of the slider mechanism respectively, and the hinge connecting the two inner members may be connected to an intermediate part of the telescopic slider.

In certain circumstances, it may be appropriate for the part of the cables leaving the electronics assembly to extend out of the assembly generally in the plane of the assembly and parallel to the pivot axis of the member connected to the assembly so that the cables can accommodate movement of the member with respect to the assembly by torsion. Alternatively or in addition, the part of the cables that passes from the articulated arm to the rack may extend parallel to the pivot axis of the articulated arm so the cable can accommodate movement of the arm with respect to the rack by torsion. Thus, it is possible according to the invention, for substantially no space in the rack behind the electronics assembly to be taken up by bending of the cables.

According to another aspect, the invention provides a rack for an electronics assembly comprising (i) a frame configured to allow the assembly it to be removed from a first side of the rack; and (ii) a cable management system comprising an articulated arm that is formed from at least two articulated members that are connected together at a joint, the arm having a first end which is attachable to the assembly and a second end which is fixed with respect to the rack so that bending of the arm about a pivot axis at the joint will accommodate movement of the assembly, wherein the articulated members are offset from one another in the direction of the pivot axis by at least their width at least in the region of the joint so that, when cables are located in the articulated arm, they will extend in a direction parallel to the pivot axis in the region of the joint.

According to yet another aspect, the invention provides a cable management system for supporting cables located at the rear of an electronics assembly within an rack, which comprises an articulated arm that is formed from at least two articulated members that are connected together at a joint, the arm having a first end which is attachable to the assembly and a second end which is fixable with respect to the rack so that bending of the arm about a pivot axis at the joint will accommodate movement of the assembly, wherein the articulated members are offset from one another in the direction of the pivot axis by at least their width at least in the region of the joint so that, when cables are located in the articulated arm, they will extend in a direction parallel to the pivot axis in the region of the joint.

According to yet a further aspect, the invention provides a chassis for an electronics assembly, which includes a cable management system at the rear thereof for supporting cables extending therefrom, the cable management system comprising an articulated arm that is formed from at least two articulated members that are connected together at a joint, the arm having a first end which is attached to the chassis and a second end which is attachable to a rack so that bending of the arm about a pivot axis at the joint will accommodate movement of the assembly into and out of the enclosure, wherein the articulated members are offset from one another in the direction of the pivot axis by at least their width at least in the region of the joint so that, when cables are located in the articulated arm, they will extend in a direction parallel to the pivot axis in the region of the joint.

BRIEF DESCRIPTION OF THE DRAWINGS

Embodiments of the present invention will now be described in detail by way of example with reference to the accompanying drawings, in which corresponding parts are given like reference numbers. In the drawings.

DESCRIPTION OF PARTICULAR EMBODIMENTS

Figure 1:
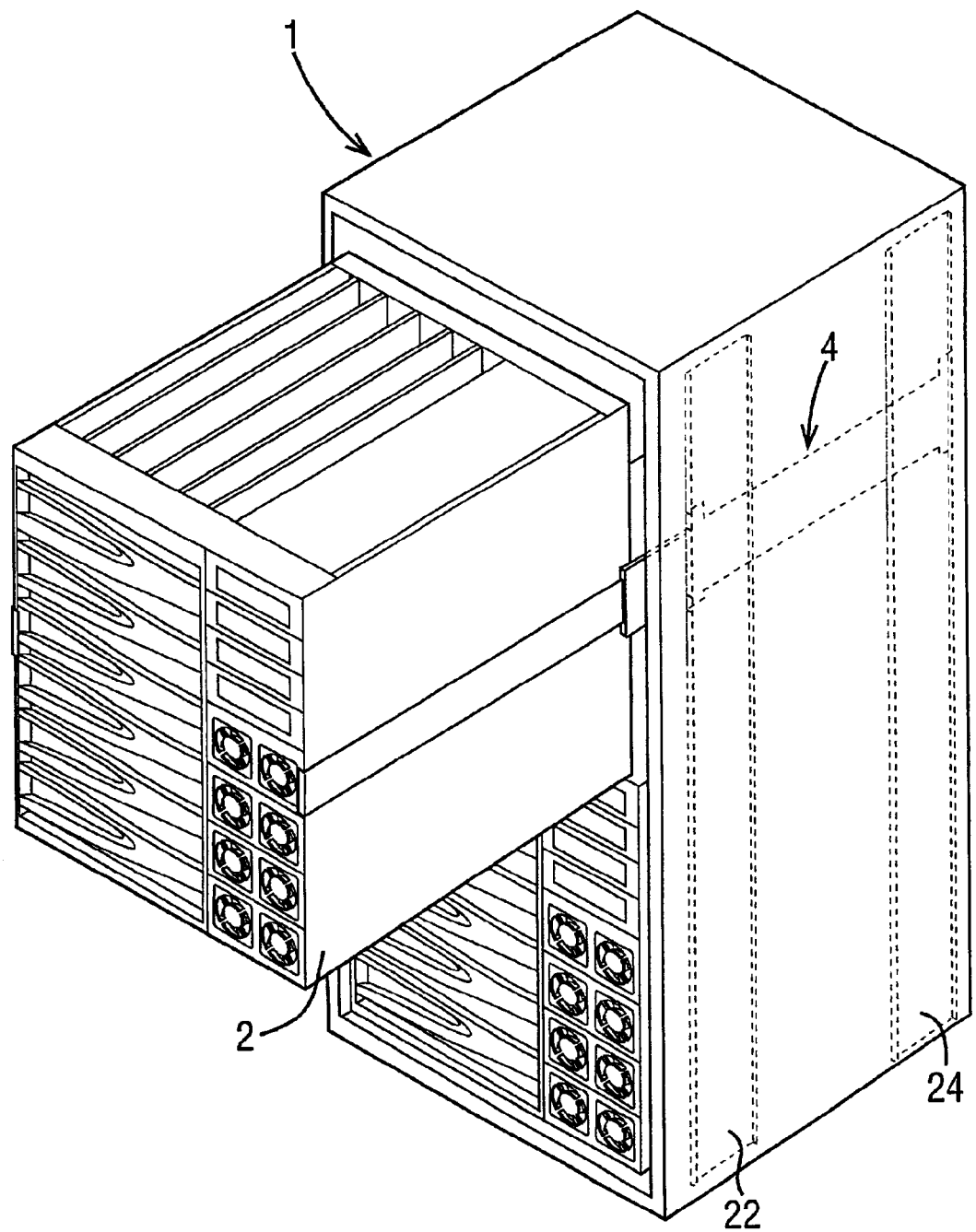
FIG. 1 is a schematic perspective view of an rack that houses a pair of electronics assemblies.

Referring now to the drawings, in which like reference numerals are used to designate corresponding elements, FIG. 1 shows an electronics rack in the form of a nineteen inch rack or cabinet 1 that houses a pair of electronics assemblies 2. Such electronics assemblies may be employed for a number of services, for example as part of a local area network (LAN) or for telecommunications purposes. Each assembly typically comprises a chassis that contains a motherboard and a number of daughterboards that are arranged in parallel planes to one another and connected to the motherboard. In addition, other components such as power modules, hard disc drives, tape drives etc. may be present.

Figure 2:
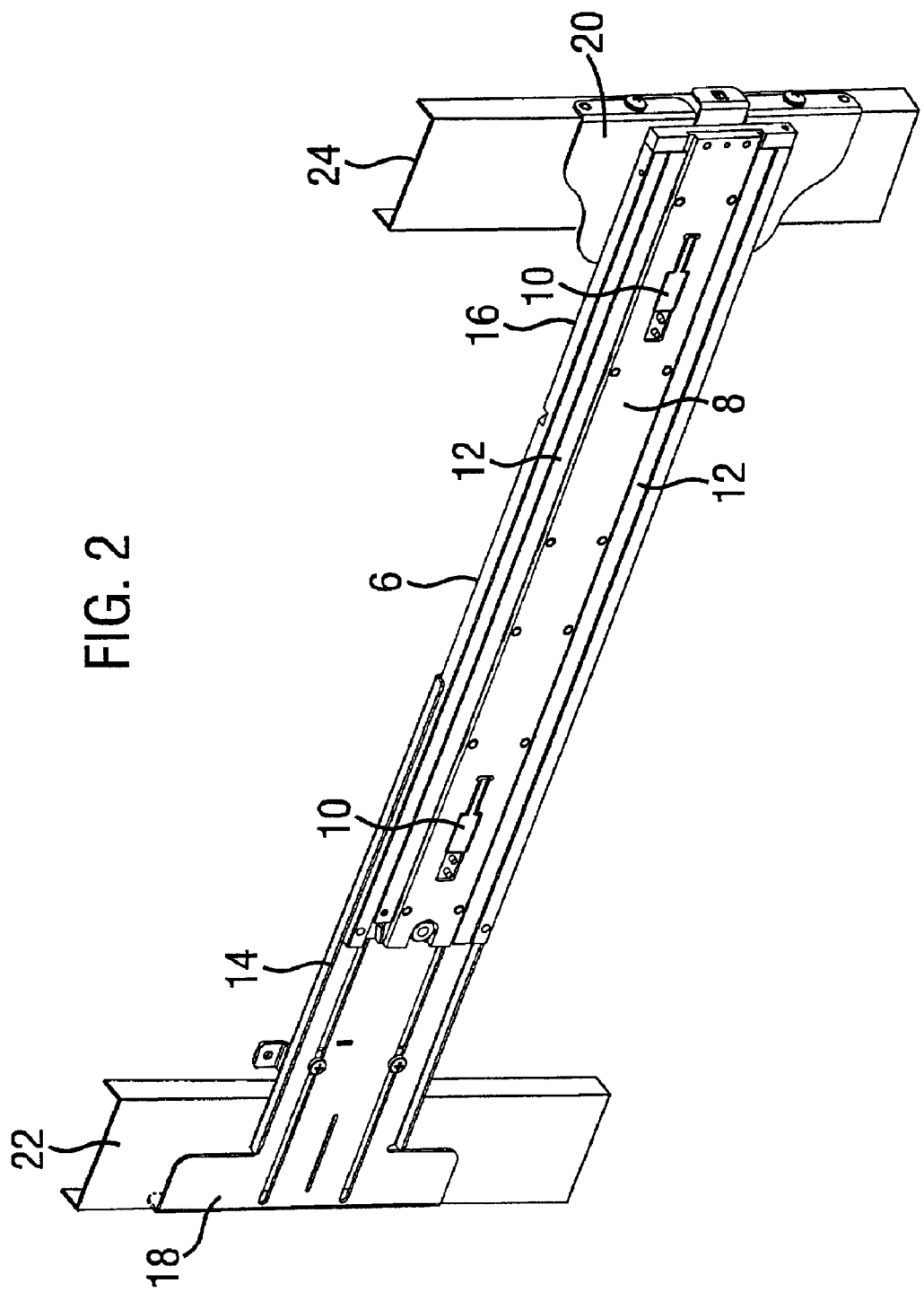
FIG. 2 is a schematic view of part of a slider mechanism employed in the rack of FIG. 1.

Both electronics assemblies 2 are supported within the cabinet 1 by means of slider mechanisms, each of which comprises a pair of telescopic sliders 4, one of which is located on each side of the cabinet (and therefore the assembly 2). One such telescopic slider 4 is shown in greater detail in FIG. 2, and comprises a fixed or stationary part 6, a movable part 8 that is attached to the chassis of the electronics assembly 2 by means of lugs on the chassis that engage recesses 10 in the movable part 8, and an intermediate part 12 that is joined to both the fixed part 6 and the movable part 8, and can slide easily with respect to the fixed and movable parts by means of a linear ball race (not shown). The fixed part 6 of the telescopic arm is, in fact, itself formed from two telescopically slidable elements 14 and 16 that terminate in brackets 18 and 20. The two elements 14 and 16 can be telescopically adjusted to alter the distance of separation of the brackets 18 and 20 so that the fixed part 6 of the telescopic arms can be fixed to posts 22 and 24 in any of a number of cabinets.

Figure 3:
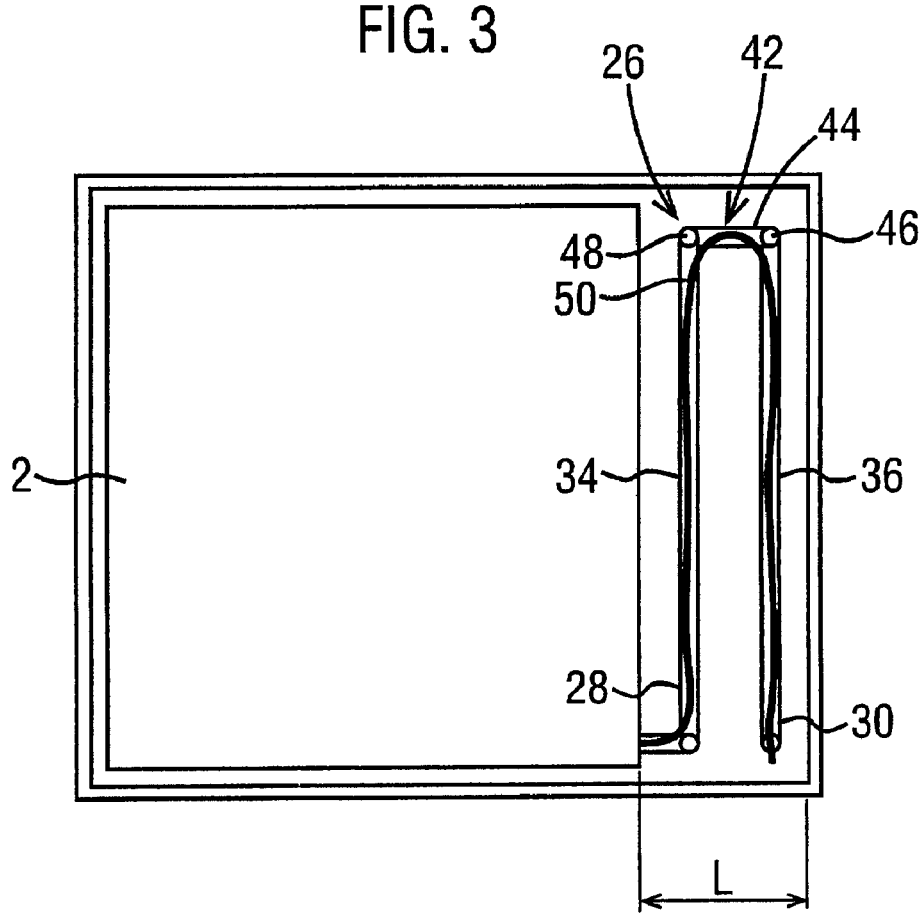
FIG. 3 is a schematic top plan view of a conventional electronics assembly and cable management system.

FIG. 3 shows such a conventional assembly from the top. Because such assemblies by their nature will have a large number of cables, both data cables and power cables, entering and exiting from a rearwardly facing surface thereof, a cable management system is provided that comprises an articulated arm 26, one end 28 of which is attached to, and movable with, the electronics assembly, and the other end 30 of which is fixed with respect to the cabinet. The articulated arm 26 is formed by two members 34 and 36 that are joined together at the mid point of the arm by means of an articulation assembly 42 so that the articulated arm 26 can accommodate movement of the electronics assembly 2 into and out of the cabinet 1 by bending and straightening respectively.

The articulation assembly 42 comprises an element 44 of the same lateral form as the members forming the articulated arm 26 which is pivotally connected to the members 34 and 36 by means of hinges 46 and 48. The element 44 of the articulation assembly is typically 5 to 10 cm in length depending of the type of cabling employed, and is provided in order to allow the cabling to bend with an appropriate bend radius. It is possible in many cases for the total length L of the part of the rack behind the assembly 2 required to house the cable management system to approach 200 mm for a nineteen inch rack.

Figure 4:
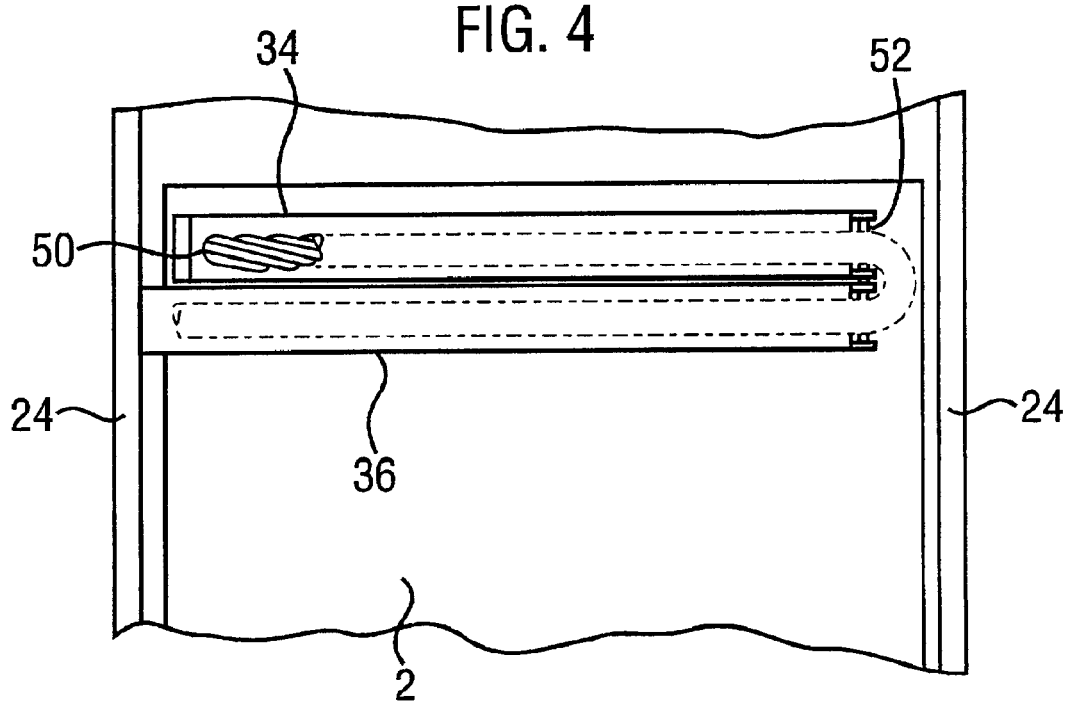
FIG. 4 is a schematic rear view of an electronics assembly having a cable management system according to one embodiment of the present invention.

FIG. 4 shows a cable management system according to one aspect of the present invention. In this case, a cable or cable bundle 50 leaves the rack 2 and extends along members 34 and 36 forming an articulated cable management arm which is pivotally fixed at its other end to one of the posts 24 in the cabinet 1. Instead of using an articulations assembly 42, the two members 34 and 36 are located at different heights so that they can be connected directly by means of a pin 52, and so that they are offset from one another at the joint by approximately their lateral dimension. This enables the cable to bend at the joint region about an axis parallel to the direction of movement of the assembly 2 so that, at the joint, the cable is parallel to the pivot axis of the members (given by the direction of pin 52), and bending and straightening of the articulated arm 26 is accommodated by torsion of the cable 50 in the region of the joint. Accordingly, a significant reduction in the space required for the cable management system can be achieved. If a larger bend radius of the cable 50 is required, the two members 34 and 36 can simply be separated by a greater vertical distance using a longer pin 52 of the joint.

Figure 5:
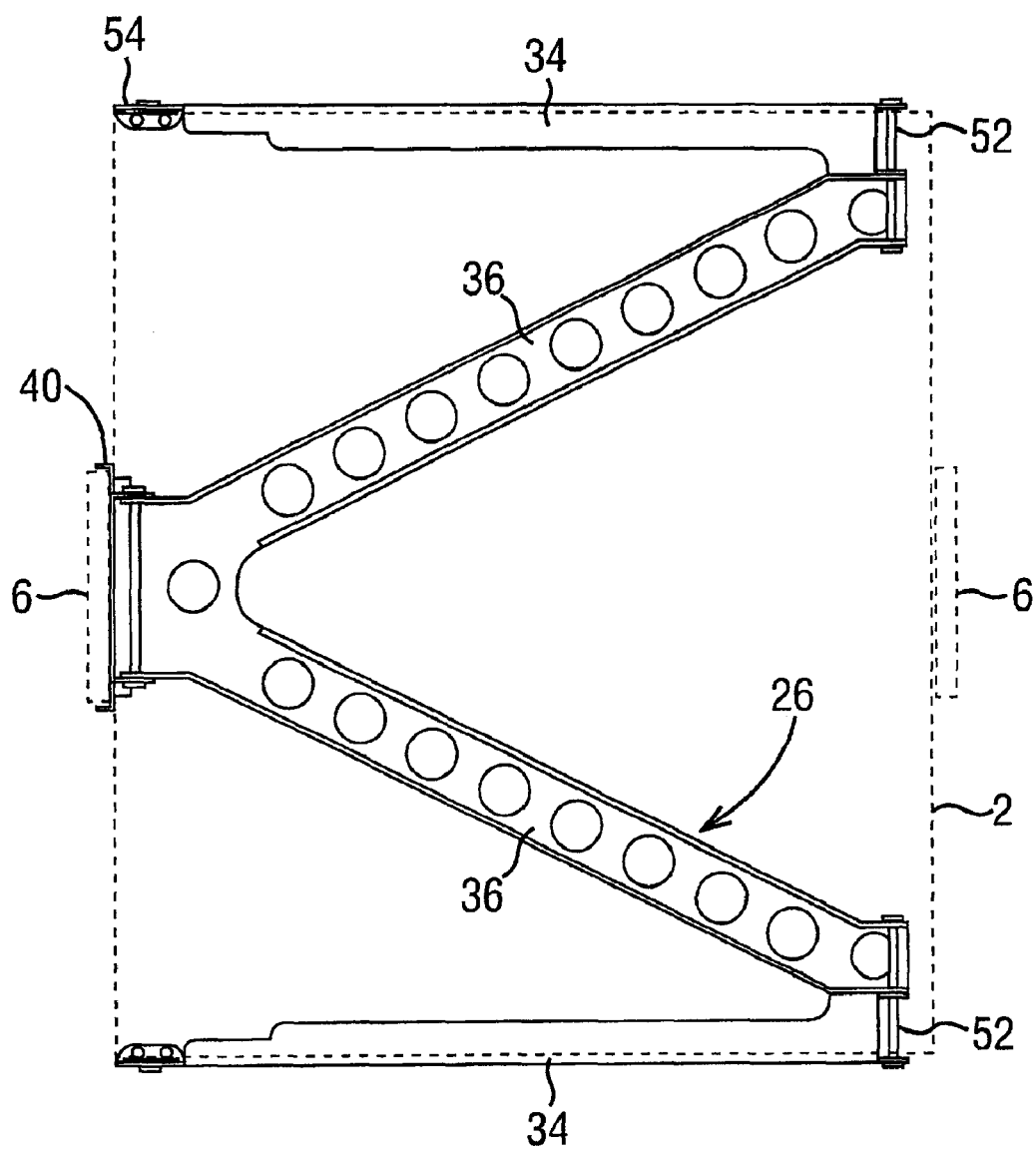
FIG. 5 is a schematic rear view of an electronics assembly having a cable management system according to another embodiment of the invention.

The cable management system shown in FIG. 4 has a further advantage over conventional systems in that the increased overall height of the articulated arm 26 provides a greater degree of strength to resist the turning moment, in the clockwise direction as viewed in FIG. 4, on the articulated arm 26 caused by the weight of the cable. This strength can be increased further if one of the members of the articulated arm 26 is diagonal as shown in FIG. 5 rather than horizontal. In this embodiment, the cable management system has two articulated arms, one located in the upper half of the electronics assembly, and the other located in the lower half. Each arm comprises a horizontal member 34 and an inclined member 36 that are joined at a joint formed by pin 52. The two inclined members 36 are formed in one piece, and are supported on the fixed part 6 of the telescopic slider 4. The horizontal members 34 are attached to the assembly by hinges 54.

The horizontal members lead the cable from the assembly to the joint, and the inclined members 36 lead the cable to the side wall of the rack as described above, while allowing a large bend radius of the cable 50 and occupying only a small space behind the assembly 2 as described above. In this case also, the height of the arm where connected to the assembly 2 and to the telescopic slider will provide it with rigidity to support the cable.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. A rack for an electronics assembly comprising:
    a supporting frame;
    an electronics assembly configured to be removed from a first side of the rack; and
    a cable management system comprising an articulated arm formed from at least two articulated members that are connected together at a joint, the arm having a first end which is attached to the assembly and a second end which is fixed with respect to the rack so that bending of the arm about a pivot axis at the joint accommodates movement of the assembly,
    wherein the cables are arranged on the articulated arm so that at least some of the cables extend in a direction parallel to the pivot axis in the region of the joint and accommodate relative movement of the articulated members by torsion.

2. A rack as claimed in claim 1, wherein the pivot axis at the joint in the articulated arm extends substantially vertically.

3. A rack as claimed in claim 1, wherein substantially all the cables extend in a direction parallel to the pivot axis in the region of the joint.

4. A rack as claimed in claim 1, wherein, in the region of the joint, the cables curve around a substantially horizontal axis that extends in the direction of movement of the assembly.

5. A rack as claimed in claim 1, wherein the articulated members are offset from one another in the direction of the pivot axis at least in the region of the joint by at least their width.

6. A rack as claimed in claim 1, wherein the articulated members are offset from one another in the direction of the pivot axis at least in the region of the joint by at least 60 mm.

7. A rack as claimed in claim 1, wherein at least one of the members is arranged obliquely to the pivot axis.

8. A rack as claimed in claim 1, wherein the cable management system includes a plurality of articulated arms.

9. A rack as claimed in claim 8, wherein one or more of the articulated arms is located on each side of the assembly.

10. A rack as claimed in claim 8, wherein one of the articulated arms is mounted above the or each other arm.

11. A rack as claimed in claim 8, wherein at least one articulated arm supports power cables, and at least one other articulated arm supports signal cables.

12. A rack as claimed in claim 1, wherein each member has a length that is approximately in the region of the width of the electronics assembly.

13. A rack as claimed in claim 1, wherein the electronics assembly is supported on a slider mechanism and the second end of the articulated arm is mounted on the slider mechanism.

14. A rack for an electronics assembly comprising:
a frame configured to allow the assembly to be removed from a first side of the rack; and
a cable management system comprising an articulated arm that is formed from at least two articulated members that are connected together at a joint, the arm having a first end which is attachable to the assembly and a second end which is fixed with respect to the rack so that bending of the arm about a pivot axis at the joint will accommodate movement of the assembly,
wherein the articulated members are offset from one another in the direction of the pivot axis by at least their width at least in the region of the joint so that, when cables are located in the articulated arm, they will extend in a direction parallel to the pivot axis in the region of the joint.

15. A rack as claimed in claim 14, wherein the members are offset from one another in the direction of the pivot axis by at least 60 millimeters.

16. A cable management system for supporting cables located at the rear of an electronics assembly within a rack, which comprises an articulated arm that is formed from at least two articulated members that are connected together at a joint, the arm having a first end which is attachable to the assembly and a second end which is fixable with respect to the rack so that bending of the arm about a pivot axis at the joint will accommodate movement of the assembly, wherein the articulated members are offset from one another in the direction of the pivot axis by at least their width at least in the region of the joint so that, when cables are located in the articulated arm, they will extend in a direction parallel to the pivot axis in the region of the joint.

17. A chassis for an electronics assembly, which includes a cable management system at the rear thereof for supporting cables extending therefrom, the cable management system comprising an articulated arm that is formed from at least two articulated members that are connected together at a joint, the arm having a first end which is attached to the chassis and a second end which is attachable to a rack so that bending of the arm about a pivot axis at the joint will accommodate movement of the assembly into and out of the enclosure, wherein the articulated members are offset from one another in the direction of the pivot axis by at least their width at least in the region of the joint so that, when cables are located in the articulated arm, they will extend in a direction parallel to the pivot axis in the region of the joint.

* * * * *